United States Patent
Chen et al.

(10) Patent No.: US 9,986,828 B2
(45) Date of Patent: Jun. 5, 2018

(54) SLIDE RAIL ASSEMBLY AND BRACKET THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 136 days.

(21) Appl. No.: 15/053,069

(22) Filed: Feb. 25, 2016

(65) Prior Publication Data
US 2017/0055707 A1    Mar. 2, 2017

(30) Foreign Application Priority Data
Aug. 31, 2015  (TW) .............................. 104128887 A

(51) Int. Cl.
| | |
|---|---|
| *A47B 88/407* | (2017.01) |
| *A47B 88/43* | (2017.01) |
| *H05K 7/14* | (2006.01) |
| *A47B 88/04* | (2006.01) |

(52) U.S. Cl.
CPC ........ *A47B 88/0407* (2013.01); *A47B 88/407* (2017.01); *A47B 88/43* (2017.01); *H05K 7/1489* (2013.01)

(58) Field of Classification Search
CPC ........... A47B 7/38; A47B 96/07; A47B 7/406; H05K 7/1489
USPC ..... 248/218.4, 219.1, 219.3, 221.11, 222.14, 248/244
See application file for complete search history.

(56) References Cited

U.S. PATENT DOCUMENTS

| | | | |
|---|---|---|---|
| 7,192,103 B2 | 3/2007 | Hamilton | |
| 7,731,142 B2 | 6/2010 | Chen et al. | |
| 8,146,756 B2 | 4/2012 | Brock et al. | |
| 8,353,494 B2 * | 1/2013 | Peng | A47B 88/43 211/192 |
| 9,629,460 B1 * | 4/2017 | Chen | H05K 7/1489 |
| 2005/0156493 A1 * | 7/2005 | Yang | H05K 7/1489 312/334.5 |
| 2009/0261699 A1 * | 10/2009 | Yu | A47B 88/43 312/334.46 |

(Continued)

FOREIGN PATENT DOCUMENTS

CN    102695396 B    12/2014

*Primary Examiner* — Muhammad Ijaz
(74) *Attorney, Agent, or Firm* — Rosenberg, Klein & Lee

(57) ABSTRACT

A slide rail assembly includes a rail, a first bracket, a second bracket, an elastic member, and a hook. The second bracket is movably mounted to the rail and has a first contact portion. The hook is movably connected to the second bracket and has a second contact portion. The hook remains at a locked position in response to the elastic force of the elastic member. The first contact portion is pressed against the second contact portion in response to displacement of the second bracket such that the hook is moved relative to the second bracket and away from the locked position.

19 Claims, 8 Drawing Sheets

(56) References Cited

U.S. PATENT DOCUMENTS

| | | | |
|---|---|---|---|
| 2013/0056432 A1* | 3/2013 | Lin | H05K 7/1489 211/123 |
| 2013/0112638 A1* | 5/2013 | Dittus | H05K 7/1489 211/123 |
| 2014/0217049 A1* | 8/2014 | Chen | H05K 7/1489 211/195 |
| 2015/0048041 A1* | 2/2015 | Chuang | H05K 7/1489 211/175 |
| 2016/0324317 A1* | 11/2016 | Chen | H05K 7/1489 |
| 2017/0095079 A1* | 4/2017 | Chen | H05K 7/1489 |
| 2017/0224110 A1* | 8/2017 | Chen | A47B 88/044 |
| 2017/0290424 A1* | 10/2017 | Chen | A47B 88/044 |
| 2017/0354055 A1* | 12/2017 | Hsu | H05K 7/1489 |
| 2018/0014640 A1* | 1/2018 | Chen | A47B 57/34 |

\* cited by examiner

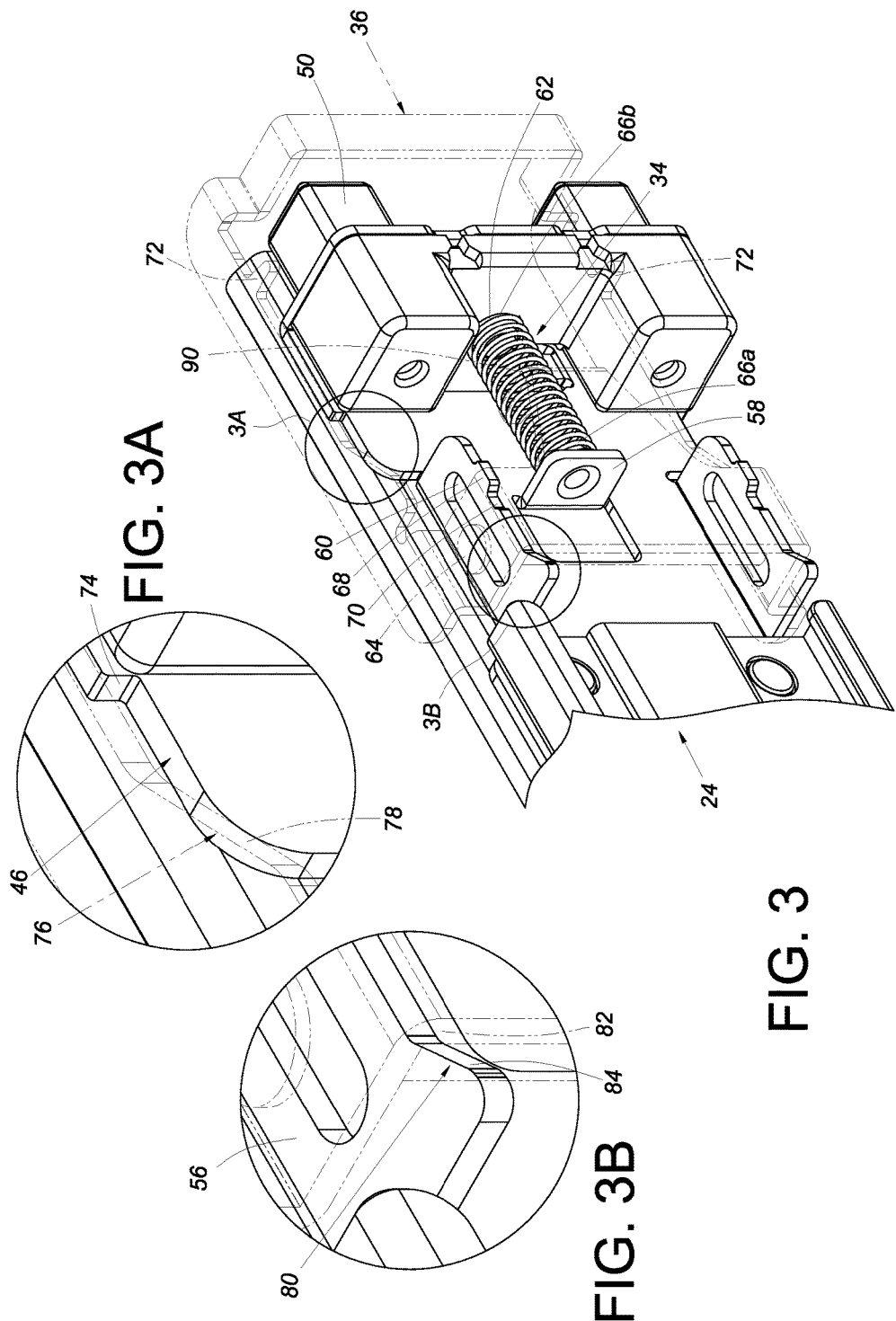

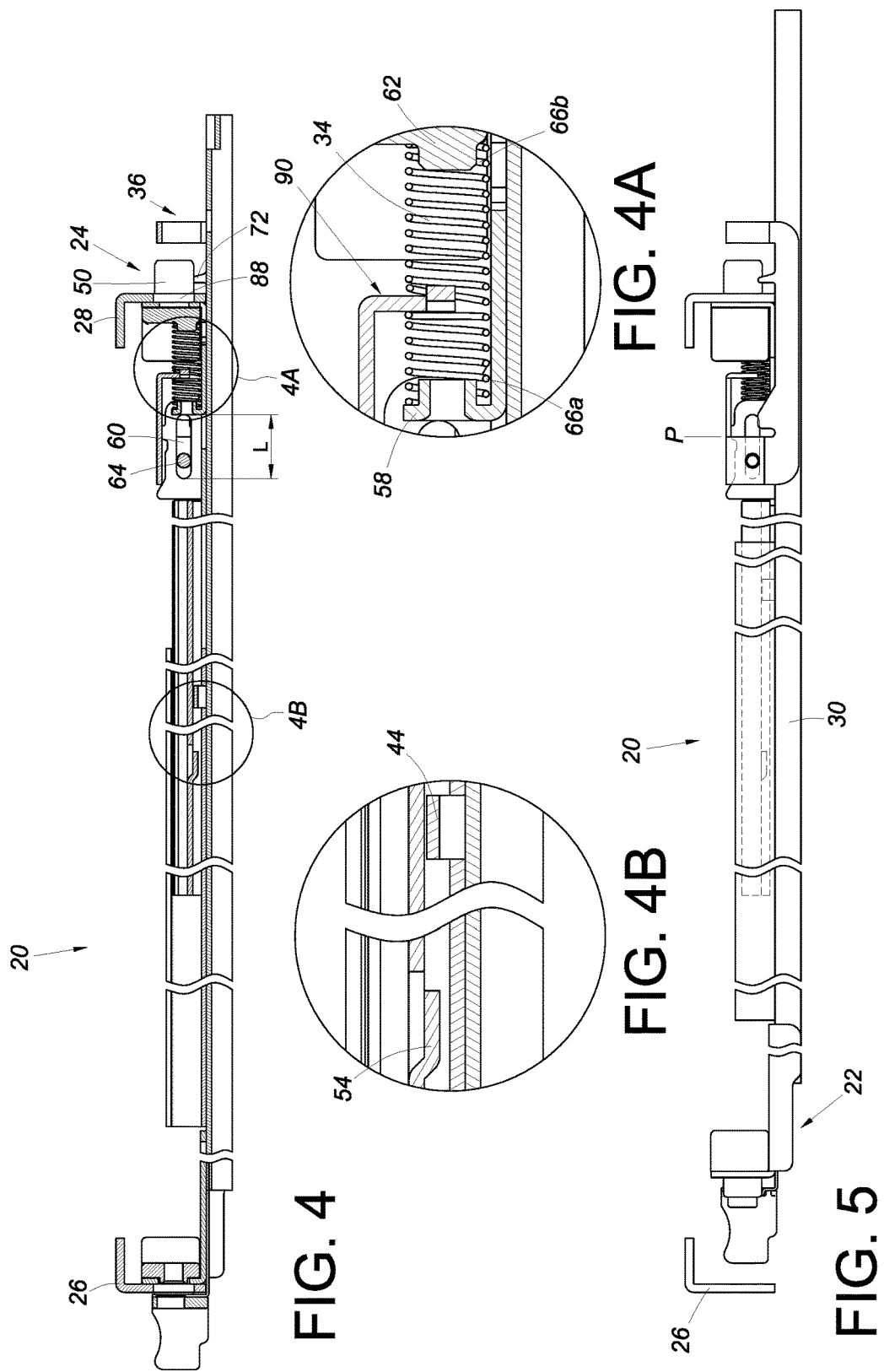

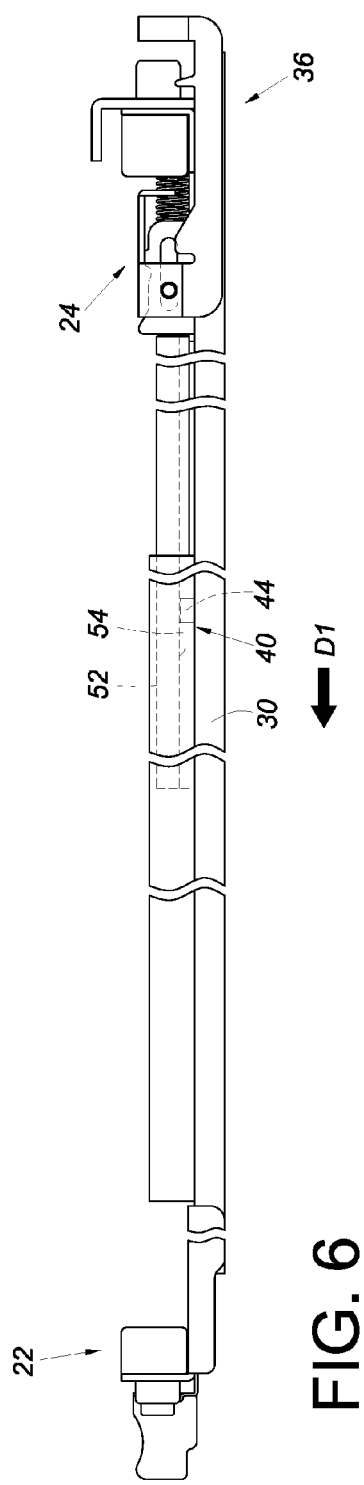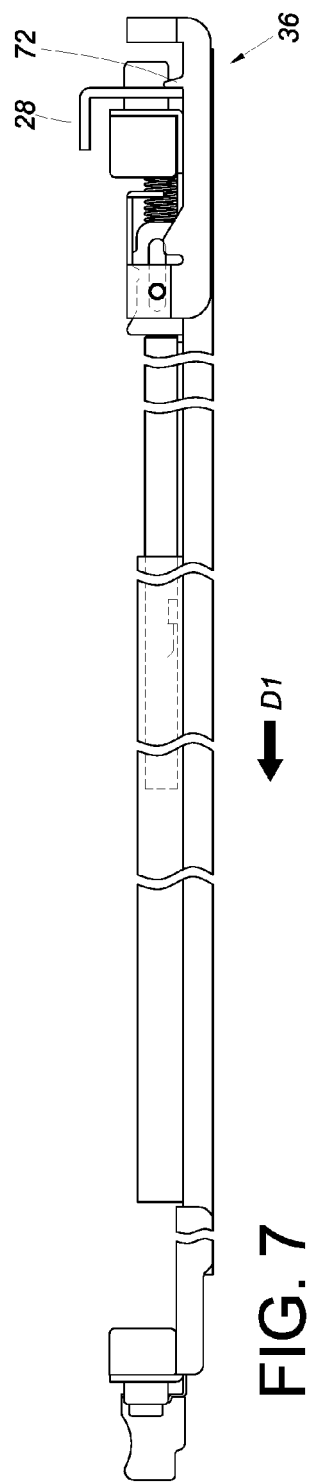

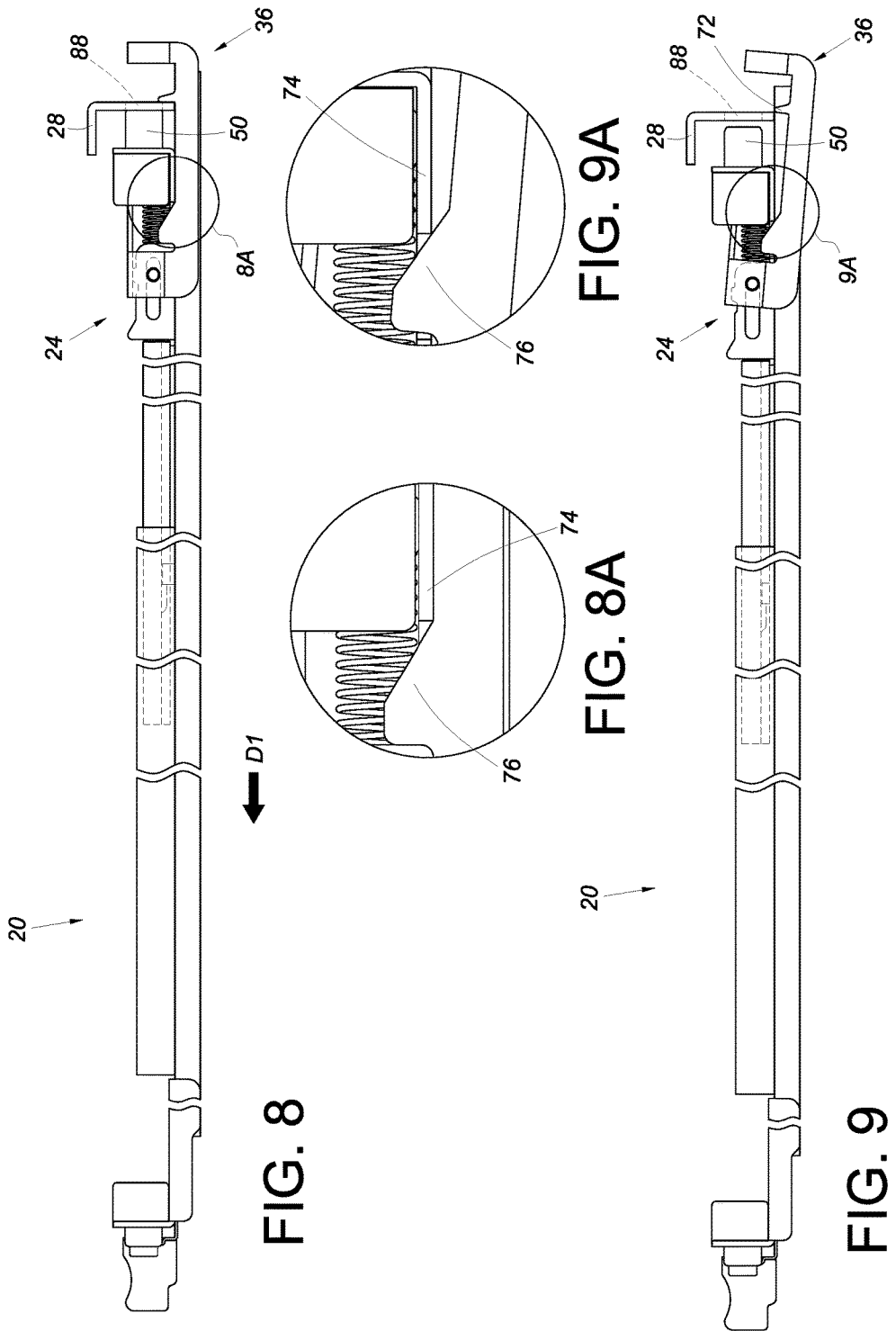

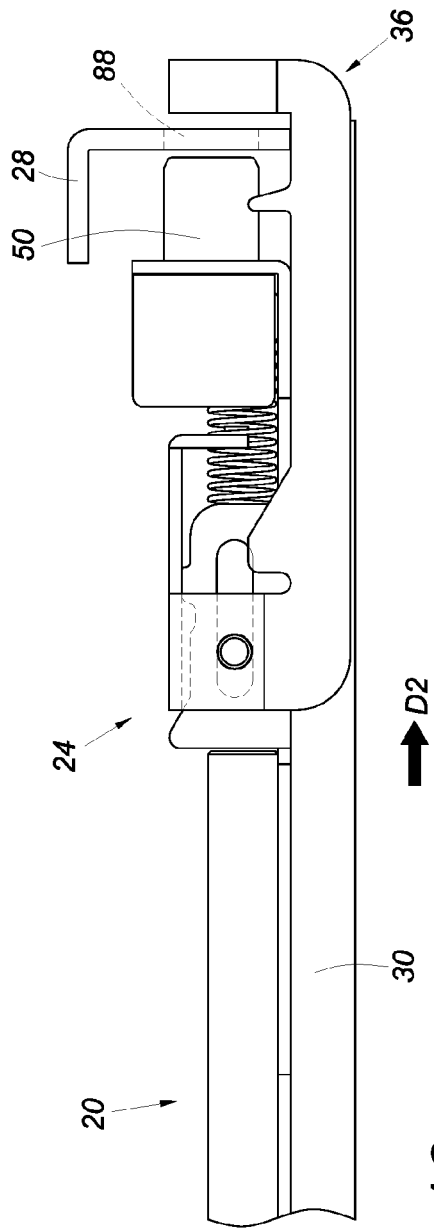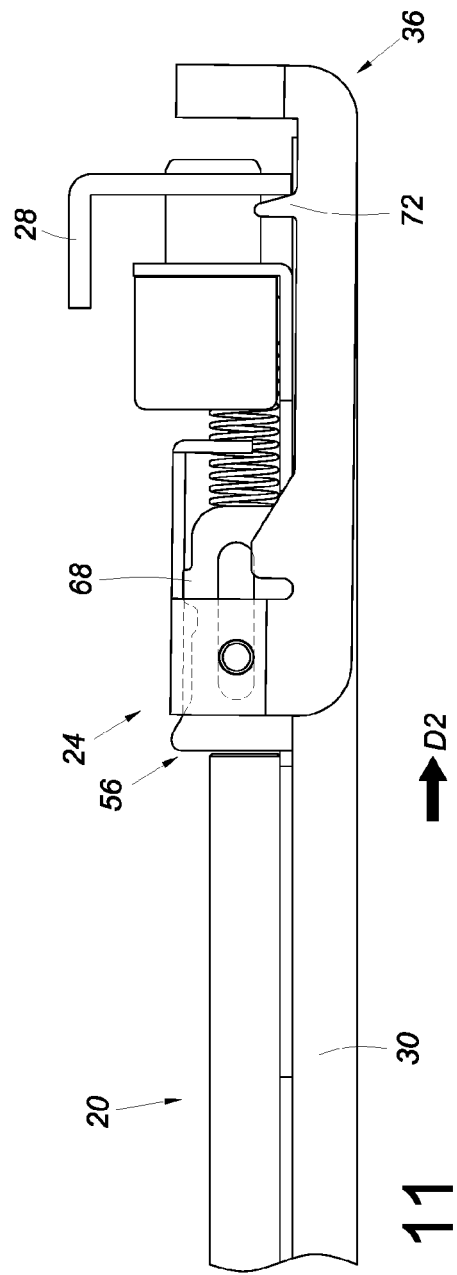

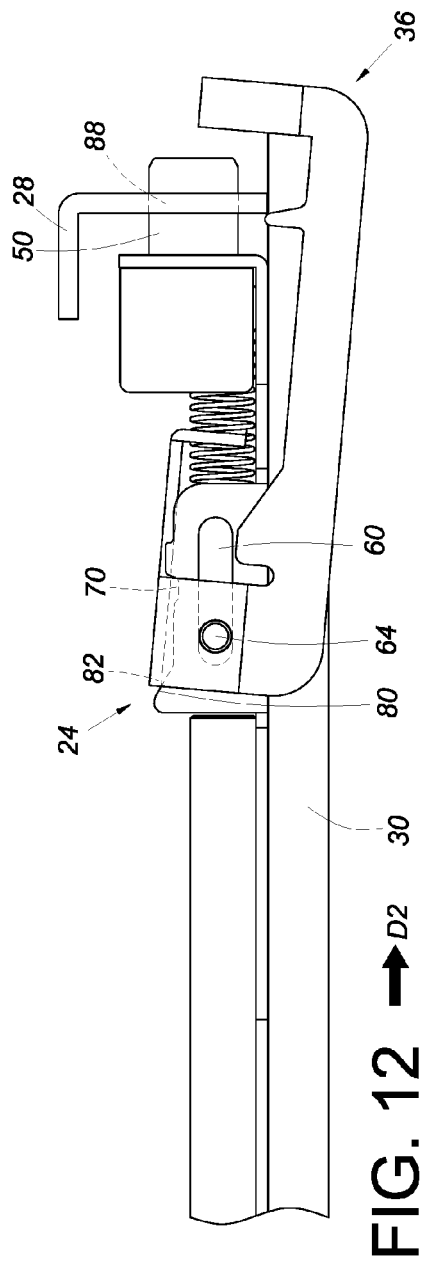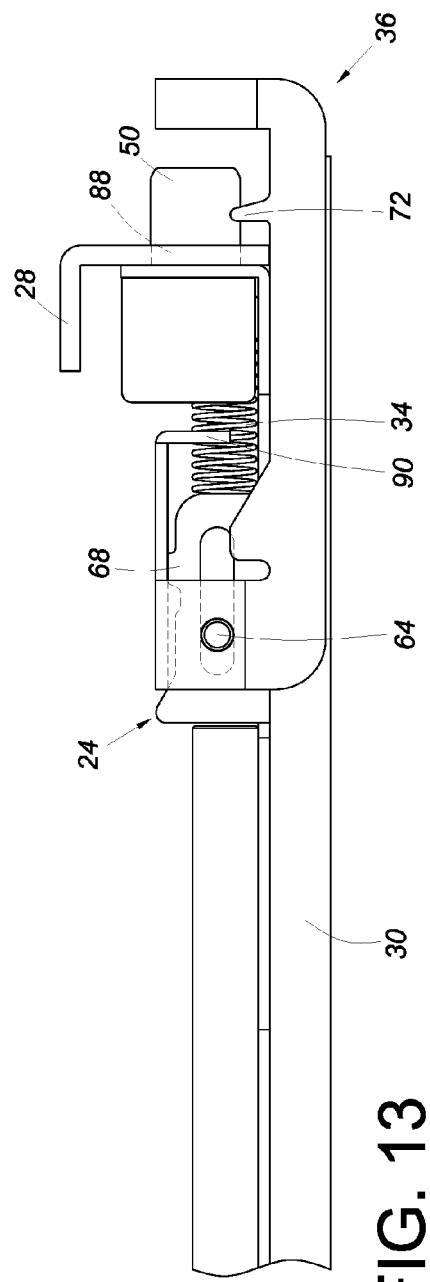

SLIDE RAIL ASSEMBLY AND BRACKET THEREOF

FIELD OF THE INVENTION

The present invention relates to a slide rail assembly and more particularly to a slide rail assembly which includes a bracket that can be easily detached from a rack.

BACKGROUND OF THE INVENTION

Chinese Patent No. 102695396B discloses a slide rail tool-free mounting frame for a server. The slide rail tool-free mounting frame includes a pair of rack positioning posts (4) provided on a slide rail rear mounting frame (1) and a rack floating hook (2). The rack floating hook (2) includes a pair of hooks (203) respectively provided on a pair of wings (205). The pair of wings (205) are each provided with a slide guide sleeve (201) and are in fixed connection through an arch-shaped bent element (206). The slide rail rear mounting frame (1) is fixedly provided with two slide guide posts (101) which are respectively sleeved in the slide guide sleeves (201) and are in fixed connection through limit screws (7). A first return spring (6) is mounted around each slide guide sleeve (201) and between the corresponding wing (205) and limit screw (7). The slide rail rear mounting frame (1) is further provided with a floating pin hole (104) in which a floating pin (3) is placed. One end of the floating pin (3) is connected to the arch-shaped bent element (206) through the corresponding limit screw (7) while the other end of the floating pin (3) is a conical head (301) provided in the floating pin hole (104). A second return spring (5) is mounted around the floating pin (3) and between an end face of the conical head (301) and the corresponding limit screw (7).

According to the above arrangement, the floating pin (3) can be driven by an outer rail member of a slide rail to lock/release the slide rail rear mounting frame (1), wherein the outer rail member is housed in the rear mounting frame. The complicated structural composition, however, may compromise overall operability.

SUMMARY OF THE INVENTION

It is an objective of the present invention to provide a slide rail assembly whose brackets can be easily detached from a rack.

Another objective of the present invention is to provide a bracket which has a locking function and can be securely attached to a post of a rack.

According to one aspect of the present invention, a bracket includes a side plate, an end plate, at least one attaching member, a hook, and an elastic member. The end plate is substantially perpendicularly connected to the side plate. The at least one attaching member is mounted to the end plate. The hook is movably connected to the side plate. The elastic member applies an elastic force to the hook in order for the hook to stay at a locked position in response to the elastic force of the elastic member. The side plate has a first contact portion, and the hook has a second contact portion. One of the first contact portion and the second contact portion includes an inclined guide surface for guiding the hook to tilt by an angle with respect to the side plate. Preferably, one of the bracket and the hook has a guiding portion of a predetermined length, and the hook is connected to the guiding portion via a connector.

According to another aspect of the present invention, a slide rail assembly configured to be attached to a first post and a second post includes a rail, a first bracket, a second bracket, a hook, and an elastic member. The first bracket is detachably attached to the first post. The second bracket is detachably attached to the second post. The second bracket is movably mounted to the rail. The second bracket has a first contact portion. The hook is movably connected to the second bracket and has a second contact portion. The elastic member applies an elastic force to the hook in order for the hook to stay at a locked position in response to the elastic force of the elastic member. After the first bracket is detached from the first post, the second bracket can be displaced in a first direction so that the first contact portion is pressed against the second contact portion in response to displacement of the second bracket, thereby tilting the hook by an angle with respect to the second bracket and hence moving the hook away from the locked position. Preferably, one of the first contact portion and the second contact portion includes an inclined guide surface. Moreover, in some embodiments, one of the second bracket and the hook has a guiding portion of a predetermined length, and the hook is connected to the guiding portion via a connector.

In some embodiments of either one of the foregoing aspects, the bracket (i.e., the second bracket) has a first pressing portion, and the hook has a second pressing portion. One of the first pressing portion and the second pressing portion includes an inclined guide section. The first pressing portion can be pressed against the second pressing portion to tilt the hook back in place with respect to the second bracket by the aforesaid angle.

In some embodiments of either one of the foregoing aspects, the bracket (i.e., the second bracket) includes a projecting section and a recessed section, and a portion of the hook corresponds to the projecting section when the hook is at the locked position.

In some embodiments of either one of the foregoing aspects, the bracket (i.e., the second bracket) has a first mounting feature and a second mounting feature opposite the first mounting feature, and the elastic member is mounted between the first mounting feature and the second mounting feature.

BRIEF DESCRIPTION OF THE DRAWINGS

FIG. 3 is a partial view of the slide rail assembly in FIG. 1;

FIG. 3A is an enlarged view of the circled area 3A in FIG. 3, showing the second contact portion corresponding to the first contact portion;

FIG. 3B is an enlarged view of the circled area 3B in FIG. 3, showing the second pressing portion corresponding to the first pressing portion;

FIG. 4 shows the slide rail assembly in FIG. 1 attached to the first post and the second post;

FIG. 4A is an enlarged view of the circled area 4A in FIG. 4, showing the mounting portion mounted between the first section and the second section of the elastic member;

FIG. 4B is an enlarged view of the circled area 4B in FIG. 4, showing the first portion corresponding to the second portion;

FIG. 5 shows the first bracket of the slide rail assembly in FIG. 4 separated from the first post;

FIG. 6 shows the rail of the slide rail assembly in FIG. 5 displaced in the first direction;

FIG. 7 shows the second bracket of the slide rail assembly in FIG. 6 displaced in the first direction along with the rail;

FIG. 8 shows the second bracket of the slide rail assembly in FIG. 7 displaced in the first direction with respect to the hook;

FIG. 8A is an enlarged view of the circled area 8A in FIG. 8, showing the first contact portion approaching the second contact portion;

FIG. 9 shows the second bracket of the slide rail assembly in FIG. 8 separated from the second post;

FIG. 9A is an enlarged view of the circled area 9A in FIG. 9, showing the first contact portion pressed against the second contact portion;

FIG. 10 shows the second bracket of the slide rail assembly in FIG. 9 displaced toward the second post;

FIG. 11 shows the second bracket of the slide rail assembly in FIG. 10 being attached to the second post, with the hook pressed against the second post;

FIG. 12 shows the second bracket of the slide rail assembly in FIG. 11 being attached to the second post, with the hook tilted back in place; and FIG. 13 shows the second bracket of the slide rail assembly in FIG. 12 attached to the second post.

DETAILED DESCRIPTION OF THE INVENTION

Figure 1:
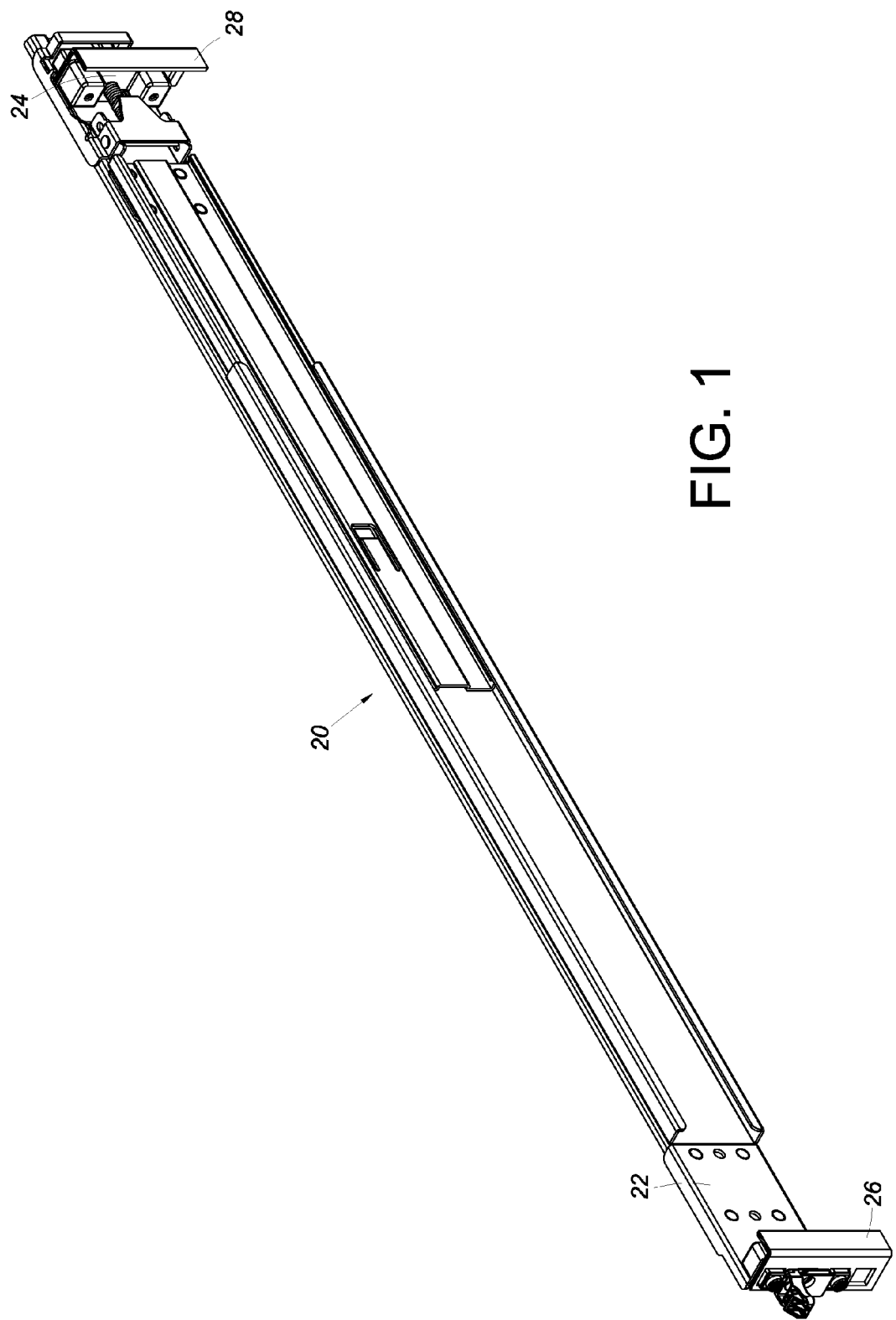
FIG. 1 is a perspective view in which the slide rail assembly in an embodiment of the present invention is attached to a first post and a second post.

Referring to FIG. 1, the slide rail assembly 20 in an embodiment of the present invention is detachably attached to a first post 26 and a second post 28 of a rack via a first bracket 22 and a second bracket 24 respectively.

Figure 2:
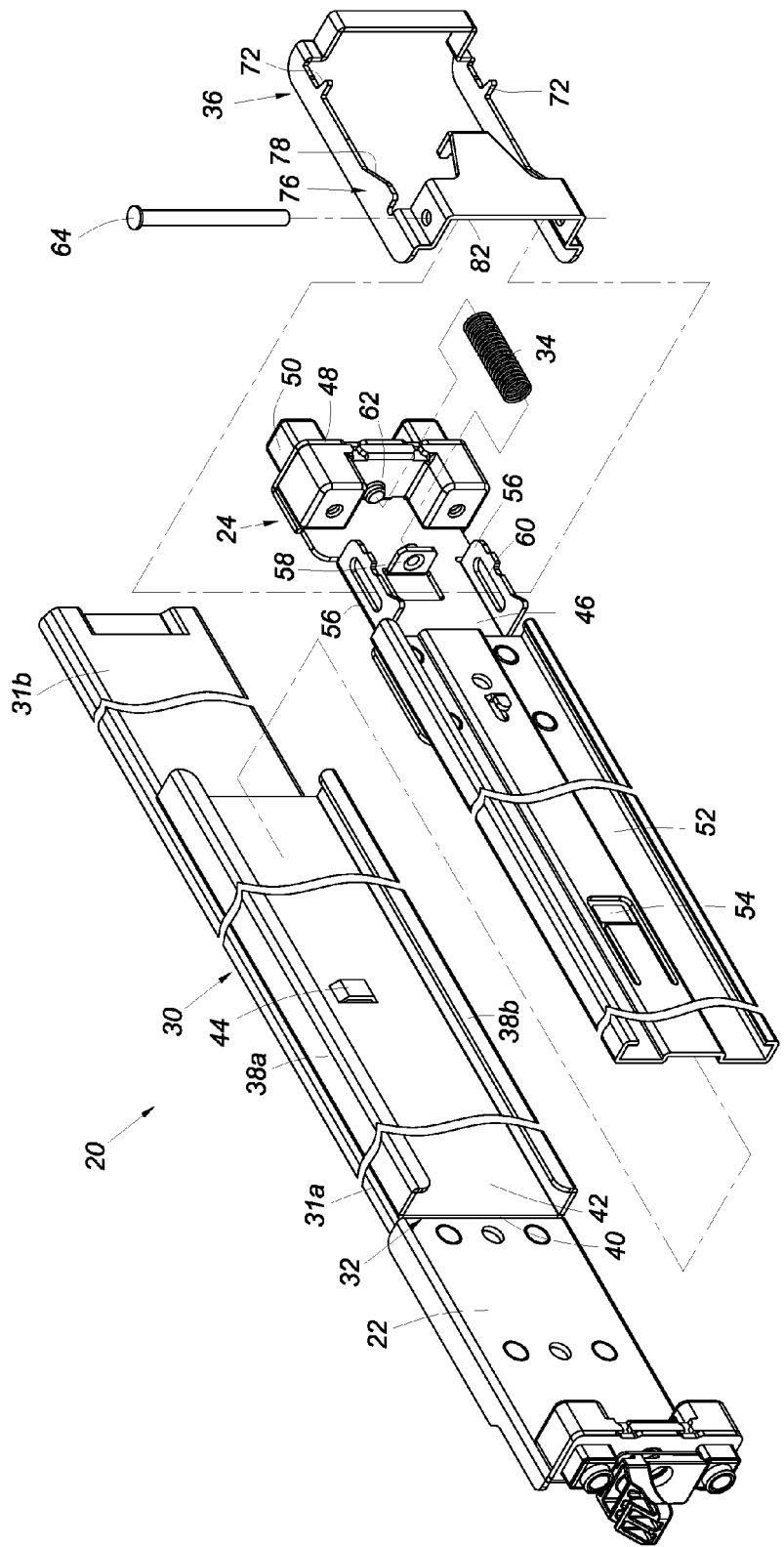
FIG. 2 is an exploded perspective view of the slide rail assembly in FIG. 1.

As shown in FIG. 2, the slide rail assembly 20 further includes a rail 30 and a supporting frame 32. The supporting frame 32 is fixedly connected to the rail 30 and can therefore be viewed as a part of the rail 30. The supporting frame 32 has an upper wall 38a, a lower wall 38b, and a longitudinal wall 40 connected between the upper wall 38a and the lower wall 38b. The upper wall 38a, the lower wall 38b, and the longitudinal wall 40 jointly define a channel 42. The longitudinal wall 40 includes a first portion 44 (e.g., a protruding block) provided in the channel 42.

The first bracket 22 is mounted to the rail 30 at a position adjacent to a first end portion 31a of the rail 30. The second bracket 24 is movably connected to the rail 30 and can be displaced along the rail 30 to a position adjacent to a second end portion 31b of the rail 30. More specifically, the second bracket 24 includes a side plate 46, an end plate 48, at least one attaching member 50, an elastic member 34, and a hook 36. The side plate 46 is movably mounted to the rail 30. In this embodiment, for example, the side plate 46 is fixedly connected with an extension member 52 and is movably mounted in the channel 42 of the supporting frame 32, wherein the extension member 52 includes a second portion 54. The side plate 46 has a pair of ears 56 and a first mounting feature 58 located between the ears 56. The pair of ears 56 extend from and are bent with respect to the side plate 46. One of the second bracket 24 and the hook 36 has a guiding portion 60, such as a longitudinal hole. In the present embodiment, each ear 56 of the second bracket 24 is provided with the guiding portion 60. The end plate 48 is substantially perpendicularly connected to the side plate 46. The at least one attaching member 50 is mounted on the end plate 48. Preferably, the second bracket 24 further includes a second mounting feature 62 opposite the first mounting feature 58. The elastic member 34 is arranged between the first mounting feature 58 and the second mounting feature 62. The hook 36 is movably connected to the second bracket 24. In this embodiment, the hook 36 is connected to the guiding portions 60 via a connector 64 for example.

Referring to FIG. 2 and FIG. 3, the hook 36 is movably connected to the second bracket 24. The elastic member 34 has a first section 66a and a second section 66b corresponding in position to the first section 66a and is mounted between the first mounting feature 58 and the second mounting feature 62. Preferably, each ear 56 of the side plate 46 of the second bracket 24 has a projecting section 68 and a recessed section 70 adjacent to the projecting section 68. The hook 36 has a pair of blocking portions 72. The pair of blocking portions 72 can be provided adjacent to the at least one attaching member 50. As shown in FIG. 3 and FIG. 3A, the second bracket 24 has a first contact portion 74 arranged on the side plate 46, and the hook 36 has a second contact portion 76 corresponding to the first contact portion 74. One of the first contact portion 74 and the second contact portion 76 includes an inclined guide surface 78. In this embodiment, for example, it is the second contact portion 76 that includes the inclined guide surface 78. Referring to FIG. 3 and FIG. 3B, the second bracket 24 further has a first pressing portion 80 arranged on each ear 56, and the hook 36 further has a second pressing portion 82 corresponding to the first pressing portions 80. Each first pressing portion 80 or the second pressing portion 82 includes an inclined guide section 84. In this embodiment, for example, each first pressing portion 80 includes the inclined guide section 84.

Referring now to FIG. 4 and FIG. 5, the second bracket 24 is attached to a hole 88 in the second post 28 via the at least one attaching member 50. The elastic member 34 applies an elastic force to the hook 36 so that the hook 36 can stay at a locked position P in response to the elastic force of the elastic member 34. More specifically, the hook 36 has a mounting portion 90 mounted between the first section 66a and the second section 66b of the elastic member 34 (see also FIG. 4A) in order to keep the hook 36 at the locked position P with respect to the second bracket 24, with the blocking portions 72 of the hook 36 corresponding to the second post 28. Each guiding portion 60 has a predetermined length L (e.g., a predetermined longitudinal length) for limiting displacement of the second bracket 24 with respect to the hook 36. In addition, the first portion 44 corresponds to the second portion 54 (see also FIG. 4B).

With continued reference to FIG. 4 and FIG. 5, when it is desired to detach the slide rail assembly 20 from the rack, the operator stands near the first post 26, releases the lock between the first bracket 22 and the first post 26 (the locking mechanism not shown), and then separates the first bracket 22 and the rail 30 from the first post 26.

Once the first bracket 22 is separated from the first post 26, referring to FIG. 6 and FIG. 7, the operator applies a force to the rail 30 to displace the rail 30 in a first direction D1. With the first portion 44 of the longitudinal wall 40 pressed against the second portion 54 of the extension member 52, the rail 30 drives the second bracket 24 into displacement in the first direction D1 such that the blocking portions 72 of the hook 36 are pressed against the second post 28.

Referring to FIG. 8 and FIG. 9, the second bracket 24 is further displaced in the first direction D1 such that the first contact portion 74 of the second bracket 24 is pressed against the second contact portion 76 of the hook 36 (see also FIG. 8A and FIG. 9A). As a result, the hook 36 is tilted by an angle with respect to the second bracket 24 and leaves the locked position P, and the blocking portions 72 of the hook 36 are no more pressed against the second post 28. The at least one attaching member 50 of the second bracket 24 can now be disengaged from the hole 88 in the second post 28, allowing the slide rail assembly 20 to separate from the second post 28. According to the above, the operator can detach the slide rail assembly 20 from the first post 26 and the second post 28 while standing near the first post 26, and the entire process can be completed easily and rapidly.

When it is desired to reattach the slide rail assembly 20 to the second post 28, referring to FIG. 10 and FIG. 11, the operator stands near the first post 26 (see also FIG. 5) and displaces the rail 30 in a second direction D2 toward the second post 28, with the at least one attaching member 50 of the second bracket 24 corresponding to the hole 88 in the second post 28. The blocking portions 72 of the hook 36 end up pressed against the second post 28.

Referring to FIG. 12, as the second bracket 24 is further displaced in the second direction D2 along with the rail 30, the first pressing portions 80 of the second bracket 24 are pressed against the second pressing portion 82 of the hook 36 such that the hook 36 is tilted by an angle with respect to the second bracket 24. Certain portions of the hook 36 are now in the recessed sections 70 of the ears 56 respectively.

When the rail 30 is further displaced in the second direction D2, as shown in FIG. 12 and FIG. 13, the hook 36 is tilted back in place with respect to the second bracket 24 by the aforesaid angle, with the blocking portions 72 of the hook 36 located on the far side of the second post 28, and the at least one attaching member 50 of the second bracket 24 attached to the hole 88 in the second post 28. Thus, the assembly process is completed. It is worth mentioning that the hook 36 eventually returns to the locked position with respect to the second bracket 24 thanks to the mounting portion 90 responding to the elastic force of the elastic member 34, and in consequence the blocking portions 72 of the hook 36 correspond to the second post 28. Moreover, certain portions of the hook 36 correspond to the projecting sections 68 respectively to ensure that the blocking portions 72 of the hook 36 stay corresponding to the second post 28. As such, a locking function is achieved which prevents the hook 36 from tilting should the hook 36 be subjected to an unwanted external force.

While the present invention has been disclosed by way of the foregoing preferred embodiment, it is understood that the embodiment is not intended to be restrictive of the invention. The scope of patent protection sought by the applicant is defined by the appended claims.

What is claimed is:

1. A slide rail system comprising:
a rail;
a first bracket detachably attached to a first post;
a second bracket detachably attached to a second post and movably mounted to the rail, the second bracket having a first contact portion;
a hook movably connected to the second bracket, the hook having a second contact portion; and
an elastic member applying an elastic force to the hook, the hook staying at a locked position in response to the elastic force of the elastic member;
wherein after the first bracket is detached from the first post, the second bracket is displaceable in a first direction so that the first contact portion is pressed against the second contact portion in response to displacement of the second bracket, thereby tilting the hook by an angle with respect to the second bracket and moving the hook away from the locked position.

2. The slide rail system of claim 1, wherein one of the first contact portion and the second contact portion includes an inclined guide surface.

3. The slide rail system of claim 1, wherein the second bracket has a first pressing portion, the hook has a second pressing portion, one of the first pressing portion and the second pressing portion includes an inclined guide section, and the first pressing portion is configured to be pressed against the second pressing portion so that the hook is tilted back in place with respect to the second bracket by the angle.

4. The slide rail system of claim 1, wherein the second bracket includes a projecting section and a recessed section, and a portion of the hook abuts the projecting section when the hook is at the locked position.

5. The slide rail system of claim 1, wherein the second bracket has a first mounting feature and a second mounting feature opposite the first mounting feature, and the elastic member is mounted between the first mounting feature and the second mounting feature.

6. The slide rail system of claim 1, wherein the second bracket has a guiding portion, the guiding portion has a predetermined length, and the hook is connected to the guiding portion via a connector.

7. The slide rail system of claim 1, wherein the hook has a guiding portion, the guiding portion has a predetermined length, and the second bracket is connected to the guiding portion via a connector.

8. A bracket, comprising:
a side plate;
an end plate substantially perpendicularly connected to the side plate;
at least one attaching member mounted to the end plate;
a hook movably connected to the side plate; and
an elastic member applying an elastic force to the hook, the hook staying at a locked position in response to the elastic force of the elastic member;
wherein the side plate has a first contact portion, the hook has a second contact portion, and one of the first contact portion and the second contact portion includes an inclined guide surface, the hook being angularly displaced between locked and unlocked positions with respect to the side plate responsive to engagement of the first and second contact portions, the hook being tilted farther away from the side plate when displaced from one of the locked and unlocked positions to the other.

9. The bracket of claim 8, wherein the side plate has a first pressing portion, the hook has a second pressing portion, and one of the first pressing portion and the second pressing portion includes an inclined guide section for guiding the hook to tilt back in place with respect to the side plate by the angle.

10. The bracket of claim 8, wherein the side plate includes a projecting section and a recessed section, and a portion of the hook abuts the projecting section when the hook is at the locked position.

11. The bracket of claim 8, wherein the side plate has a guiding portion, the guiding portion has a predetermined length, and the hook is connected to the guiding portion via a connector.

12. The slide rail system of claim 8, wherein the hook has a guiding portion, the guiding portion has a predetermined length, and the side plate is connected to the guiding portion via a connector.

13. A slide rail device for use with a first post and a second post comprising:
- a rail;
- a first bracket configured for detachable coupling to the first post;
- a second bracket configured for detachable coupling to the second post, the second bracket being movably mounted to the rail, the second bracket having a first contact portion;
- a hook movably connected to the second bracket, the hook having a second contact portion; and
- an elastic member applying an elastic force to keep the hook at a locked position in response to the elastic force of the elastic member;
- wherein the first bracket is configured to be detached from the first post, the second bracket is displaceable in a first direction so that the first contact portion is pressed against the second contact portion in response to displacement of the second bracket, thereby tilting the hook by an angle with respect to the second bracket and moving the hook away from the locked position.

14. The slide rail device of claim 13, wherein one of the first contact portion and the second contact portion includes an inclined guide surface.

15. The slide rail device of claim 13, wherein the second bracket has a first pressing portion, the hook has a second pressing portion, one of the first pressing portion and the second pressing portion includes an inclined guide section, and the first pressing portion is configured to be pressed against the second pressing portion so that the hook is tilted back in place with respect to the second bracket by the angle.

16. The slide rail device of claim 13, wherein the second bracket includes a projecting section and a recessed section, and a portion of the hook abuts the projecting section when the hook is at the locked position.

17. The slide rail device of claim 13, wherein the second bracket has a first mounting feature and a second mounting feature opposite the first mounting feature, and the elastic member is mounted between the first mounting feature and the second mounting feature.

18. The slide rail device of claim 13, wherein the second bracket has a guiding portion, the guiding portion has a predetermined length, and the hook is connected to the guiding portion via a connector.

19. The slide rail system of claim 13, wherein the hook has a guiding portion, the guiding portion has a predetermined length, and the second bracket is connected to the guiding portion via a connector.

* * * * *